United States Patent
Bauswell (10) Patent No.: US 11,495,664 B2
(45) Date of Patent: *Nov. 8, 2022

(54) DOPED DIAMOND SEMICONDUCTOR AND METHOD OF MANUFACTURE USING LASER ABLATION

(71) Applicant: Adamantite Technologies LLC, San Jose, CA (US)

(72) Inventor: Eric David Bauswell, Eldridge, IA (US)

(73) Assignee: Adamantite Technologies LLC, Eldridge, IA (US)

( * ) Notice: Subject to any disclaimer, the term of this patent is extended or adjusted under 35 U.S.C. 154(b) by 22 days.

This patent is subject to a terminal disclaimer.

(21) Appl. No.: 16/915,430

(22) Filed: Jun. 29, 2020

(65) Prior Publication Data

US 2020/0335586 A1 Oct. 22, 2020

Related U.S. Application Data

(63) Continuation of application No. 16/011,410, filed on Jun. 18, 2018, now Pat. No. 10,700,165, which is a
(Continued)

(51) Int. Cl.
*H01L 29/16* (2006.01)
*H01L 21/02* (2006.01)
(Continued)

(52) U.S. Cl.
CPC .......... *H01L 29/1602* (2013.01); *B82Y 10/00* (2013.01); *B82Y 40/00* (2013.01);
(Continued)

(58) Field of Classification Search
CPC .......... H01L 29/1602; H01L 21/02115; H01L 21/02266; H01L 21/02527; H01L 21/0257;
(Continued)

(56) References Cited

U.S. PATENT DOCUMENTS

| 1,998,024 A | 4/1935 | Powers |
| 2,146,441 A | 2/1939 | Powers |

(Continued)

FOREIGN PATENT DOCUMENTS

| JP | 2004071526 A | 3/2004 |
| RU | 2585311 C1 | 5/2016 |

(Continued)

OTHER PUBLICATIONS

Narayan, Jagdish, et al, Novel phase of carbon, ferromagnetism, and conversion into diamond, Journal of Applied Physics 118, 215303 (2015); doi: 10.1063/1.4936595, AIP Publishing LLC.
(Continued)

*Primary Examiner* — Selim U Ahmed
(74) *Attorney, Agent, or Firm* — Hamilton IP Law, PC; Jay R. Hamilton; Charles A. Damschen (57) ABSTRACT

A doped diamond semiconductor and method of production using a laser is disclosed herein. As disclosed, a dopant and/or a diamond or sapphire seed material may be added to a graphite based ablative layer positioned below a confinement layer, the ablative layer also being graphite based and positioned above a backing layer, to promote formation of diamond particles having desirable semiconductor properties via the action of a laser beam upon the ablative layer. Dopants may be incorporated into the process to activate the reaction sought to produce a material useful in production of a doped semiconductor or a doped conductor suitable for the purpose of modulating the electrical, thermal or quantum properties of the material produced. As disclosed, the diamond particles formed by either the machine or method of confined pulsed laser deposition disclosed may be arranged as semiconductors, electrical components, thermal components, quantum components and/or integrated circuits.

18 Claims, 7 Drawing Sheets

Related U.S. Application Data continuation-in-part of application No. 15/836,570, filed on Dec. 8, 2017, now abandoned, which is a continuation-in-part of application No. 15/627,426, filed on Jun. 19, 2017, now abandoned.

(60) Provisional application No. 62/351,403, filed on Jun. 17, 2016.

(51) Int. Cl.

| | | |
|---|---|---|
| *C23C 14/04* | (2006.01) | |
| *C23C 14/06* | (2006.01) | |
| *H01L 29/167* | (2006.01) | |
| *H01L 29/66* | (2006.01) | |
| *H01L 21/82* | (2006.01) | |
| *C23C 14/28* | (2006.01) | |
| *B82Y 10/00* | (2011.01) | |
| *B82Y 40/00* | (2011.01) | |
| *H01L 49/02* | (2006.01) | |
| *C23C 14/22* | (2006.01) | |
| *H01L 27/092* | (2006.01) | |

(52) U.S. Cl.
CPC ........ *C23C 14/048* (2013.01); *C23C 14/0611* (2013.01); *C23C 14/28* (2013.01); *H01L 21/0257* (2013.01); *H01L 21/02115* (2013.01); *H01L 21/02266* (2013.01); *H01L 21/02527* (2013.01); *H01L 21/02576* (2013.01); *H01L 21/02581* (2013.01); *H01L 21/02631* (2013.01); *H01L 21/02678* (2013.01); *H01L 21/8206* (2013.01); *H01L 28/22* (2013.01); *H01L 28/40* (2013.01); *H01L 29/167* (2013.01); *H01L 29/66015* (2013.01); *H01L 29/66045* (2013.01); *H01L 29/66977* (2013.01); *C23C 14/221* (2013.01); *H01L 27/092* (2013.01); *H01L 29/66439* (2013.01)

(58) Field of Classification Search
CPC ......... H01L 21/02576; H01L 21/02581; H01L 21/02631; H01L 21/02678; H01L 21/8206; H01L 28/22; H01L 28/40; H01L 29/167; H01L 29/66015; H01L 29/66045; H01L 29/66977; H01L 27/092; H01L 29/66439; B82Y 10/00; B82Y 40/00; C23C 14/048; C23C 14/0611; C23C 14/28; C23C 14/221

See application file for complete search history.

(56) References Cited

U.S. PATENT DOCUMENTS

| | | |
|---|---|---|
| 2,346,455 A | 1/1942 | Russell |
| 2,499,118 A | 2/1950 | Sipes |
| 2,785,556 A | 3/1957 | Smith |
| 2,792,699 A | 5/1957 | Lamm |
| 2,818,714 A | 1/1958 | Inns |
| 4,116,139 A | 9/1978 | Sauer |
| 4,260,366 A | 4/1981 | Karlyk |
| 4,424,018 A | 1/1984 | Lowther |
| 5,254,237 A | 10/1993 | Snaper et al. |
| 5,491,348 A | 2/1996 | Koyamao et al. |
| 5,633,513 A * | 5/1997 | Koyama ............. H01L 29/1602 257/410 |
| 5,899,685 A | 5/1999 | Thigpen |
| 6,484,653 B2 | 11/2002 | Swanson |
| 6,527,546 B1 | 3/2003 | Laforest et al. |
| 6,619,950 B2 | 9/2003 | Ricci |
| 6,733,279 B2 | 5/2004 | Thigpen et al. |
| 7,226,284 B2 | 6/2007 | Avelar |
| 7,497,684 B1 | 3/2009 | Storms |
| 7,607,916 B2 | 10/2009 | Almodovar |
| 8,146,519 B2 | 4/2012 | Bassett |
| 8,158,455 B2 | 4/2012 | Linares et al. |
| 8,237,170 B2 | 8/2012 | Ikeda et al. |
| 8,499,599 B2 | 8/2013 | Cheng et al. |
| 8,702,419 B2 | 4/2014 | Simpson |
| 8,735,907 B2 | 5/2014 | Yamada et al. |
| 8,933,462 B2 | 1/2015 | Khan |
| 8,939,107 B2 | 1/2015 | Yang et al. |
| 2002/0146656 A1 | 10/2002 | Thigpen et al. |
| 2004/0071526 A1 | 4/2004 | Lesecq |
| 2006/0073431 A1 | 4/2006 | Brown |
| 2006/0099540 A1 | 5/2006 | Avelar |
| 2007/0072140 A1 | 3/2007 | Almodovar |
| 2008/0076082 A1 | 3/2008 | Wolfson |
| 2008/0132733 A1 | 6/2008 | Manzer et al. |
| 2008/0153043 A1 | 6/2008 | Avelar et al. |
| 2009/0016280 A1 | 1/2009 | Iyer et al. |
| 2009/0162804 A1 | 6/2009 | Masterson et al. |
| 2011/0156055 A1 * | 6/2011 | Mazellier ............ H01L 31/0248 257/77 |
| 2011/0210479 A1 | 9/2011 | Yang et al. |
| 2011/0244406 A1 | 10/2011 | Simpson |
| 2011/0281224 A1 | 11/2011 | Dickie |
| 2012/0049239 A1 | 3/2012 | Sung |
| 2013/0302740 A1 | 11/2013 | Belczak |
| 2015/0315722 A1 | 11/2015 | Nzama et al. |
| 2016/0076355 A1 | 3/2016 | Scott et al. |
| 2016/0336233 A1 | 11/2016 | Yonehara et al. |

FOREIGN PATENT DOCUMENTS

| | | |
|---|---|---|
| RU | 2597447 C2 | 9/2016 |
| WO | 2008132733 A1 | 11/2008 |
| WO | 2015034494 A1 | 3/2015 |

OTHER PUBLICATIONS

RU ISA, Notification of Transmittal of the International Search Report and The Written Opinion of the International Searching Authority, PCT/US2018/038099, Applicant Adamantite Technologies LLC, dated Oct. 25, 2018.

Schwander, Michael, A Review of Diamond Synthesis by CVD Processes, Diamond & Related Materials, 2011. abstract & p. 1293, paragraph 3.2.3, Elsevier B.V.

Supplementary European Search Report, European Patent Office, BauswellE-P1003-EP, dated Mar. 5, 2021.

* cited by examiner

FIG. 1 - PRIOR ART US PAT. 8,939,107

DOPED DIAMOND SEMICONDUCTOR AND METHOD OF MANUFACTURE USING LASER ABLATION

CROSS REFERENCE TO RELATED APPLICATIONS

This application is a continuation of and claims benefit of utility non-provisional patent application Ser. No. 16/011,410 (issued as U.S. Pat. No. 10,700,165) which is a continuation-in-part of and claims benefit of utility non-provisional patent application Ser. No. 15/836,570 filed on Dec. 8, 2017 which is a continuation-in-part of and claims benefit of utility non-provisional patent application Ser. No. 15/627,426 filed on Jun. 19, 2017 which claimed priority and benefit from US Utility Provisional Patent Application No. 62/351,403 filed Jun. 17, 2016, all of which are incorporated by reference herein in their entireties.

STATEMENT REGARDING FEDERALLY SPONSORED RESEARCH OR DEVELOPMENT

No federal funds were used to create or develop the invention herein.

REFERENCE TO SEQUENCE LISTING, A TABLE, OR A COMPUTER PROGRAM LISTING COMPACT DISK APPENDIX

N/A

BACKGROUND OF THE INVENTION—FIELD OF THE INVENTION

A wide variety of semiconductor devices are used as basic electronic building blocks to form electronic devices from computers to cellular telephones, home entertainment systems, and automobile control systems. Other devices use semiconductors for purposes not related to computing or processing power, such as audio amplifiers, industrial control systems, and for other such purposes.

Modern semiconductors are typically based on silicon, with dopants added to change their electrical properties. For example, doping silicon with phosphorous creates a surplus of electrons resulting in n-type semiconductor material due to the fifth valence electron not present in silicon, which has only four valence electrons. Similarly, doping silicon with boron creates p-type silicon having a surplus of "holes", or an absence of electrons, because boron has only three valence electrons which is one fewer than silicon.

When n-type and p-type silicon are in contact with one another, electricity flows in one direction across the junction more easily than in the other direction. More complex configurations of n-type and p-type material can be assembled to form various types of transistors, integrated circuits, and other electronic devices.

But, the performance of certain semiconductor devices is limited by the properties inherent in the semiconductor materials used. For example, a processor's speed is limited by the amount of power that can be dissipated in the transistors and other devices that make up the processor integrated circuit, which can literally melt if operated too fast. Reduction in size is also limited, because as more transistors dissipating a certain amount of power are packed into a smaller area, the amount of heat dissipated in a certain area increases. Even simple devices such as diodes used in high-frequency, high-power applications suffer from power limitations, since the physical size of an individual transistor or diode is typically very small. Semiconductor devices enabling greater power dissipation and higher semiconductor device densities are desirable to provide higher performance, smaller electrical devices. As disclosed, doped diamond semiconductors provide a type of a semiconductor which may enable greater power dissipation and higher semiconductor device densities. Further, fabrication of doped diamond semiconductors and integrated circuits based on those doped diamond semiconductors using the methods disclosed herein including via laser ablation, maybe produced at extremely low cost promoting widespread adoption and replacement of traditional silicon based semi-conductors. In other embodiments, the graphite material may be doped prior to laser ablation to manipulate either the thermal properties or the quantum state properties, or both, wherein the laser ablated doped graphite material is an improved thermal conductor or enables the quantum state characteristics of the diamond structure produced.

PRIOR ART

The present disclosure for production of doped diamond semiconductors is generally meant to fully enable one of ordinary skill in the art and is not meant to limit the breadth of the invention or the scope of the claims to any one particular doped diamond semiconductor as the present disclosure may be used for production of any doped diamond semiconductor useful in production of integrated circuits as commonly found in electronic devices. The following US patents provide an additional discussion and disclosure on doped diamond semiconductors and are incorporated by reference herein in their entirety:

1. U.S. Pat. No. 8,933,462 titled Method of Fabricating Diamond Semiconductor and Diamond Semiconductor formed according to the Method;
2. U.S. Pat. No. 8,735,907 titled Ohmic Electrode for Use in Semiconductor Diamond Device;
3. U.S. Pat. No. 8,237,170 tided "Schottky Diamond Semiconductor Device and Manufacturing Method for A Schottky Electrode for Diamond Semiconductor Device";
4. U.S. Pat. No. 8,158,455 titled "Boron-doped diamond semiconductor";
5. U.S. Pat. No. 5,254,237 titled "Plasma Arc Apparatus for Producing Diamond Semiconductor Devices";
6. U.S. Pat. No. 5,254,237 titled "Plasma arc apparatus for producing diamond semiconductor devices"; the preceding references are included herein for purposes of enablement and may be claimed in whole or in part, for their teachings in the implementation of the present disclosure, and are fully incorporated by reference herein. Applicant's inclusion of multiple references herein is not an admission that any particular reference or references, alone or in combination, is necessarily relevant or anticipates or makes obvious the present disclosure.

SUMMARY OF DISCLOSURE

Fabrication of doped diamond semiconductors and conductors using lasers is disclosed and particularly using a laser to ablate a quantity of carbon based starter material, and with or without metals proximate the carbon based starter material, and with or without various doping materials (dopants) and/or seeding materials (diamonds or sapphires) positioned between an upper transparent confinement layer and a lower backing plane, the carbon based starter material arranged therein to form a diamond based semiconductor or conductor useful for production of electrical components, integrated circuits, thermal conductors or materials having quantum state characteristics useful for computer applications on application of the laser to the carbon based starter material. As disclosed, the laser-based method of production of a doped diamond semiconductor allows for fine control of crystallization growth. For the purposes of this disclosure, dopants (doping materials) are added for a similar purpose as they would be for carrier generation/creation in a silicon based semiconductor, as doping intentionally introduces impurities into an for the purpose of modulating its electrical properties. The impurities are dependent upon the type of semiconductor and the properties that it needs to have for its intended purpose. Lightly and moderately doped semiconductors are referred to as extrinsic semiconductors. A semiconductor doped to such high levels that it acts more like a conductor than a semiconductor is referred to as a degenerate semiconductor. As disclosed herein, possible doping materials (dopant) may include, without restriction or limitation the following: boron, aluminum, nitrogen, gallium, indium, phosphorus, phosphine gas, arsenic, antimony, bismuth, lithium, germanium, silicon, xenon, gold, platinum, gallium arsenide, tellurium, sulphur, tin, zinc, chromium, gallium phosphide, magnesium, cadmium telluride, chlorine, sodium, cadmium sulfide, iodine, fluorine, each acting alone or in combination with any of the preceding elements, in any formulation, to activate the reaction sought to produce a material useful in production of a semiconductor or conductor suitable for the purpose of modulating the electrical, thermal or quantum state properties of the material or component produced. Nitrogen may have particular value for quantum computing applications and substrates. One of ordinary skill will appreciate that when using dopants with this process, to manipulate thermal properties or quantum state properties, wherein nitrogen would be the dopant, the resulting diamond material is not by definition a diamond semiconductor, but instead either a thermal conductor or substrate useful for quantum computing, as will be discussed further herein. U.S. Pat. Nos. 8,939,107 and 8,499,599 are incorporated by reference herein as related to use and methods of using lasers for conversion of carbon particles to diamond particles. The preceding US patents are included herein for purposes of enablement and may be claimed in whole or in part, for their teachings in the implementation of the present disclosure, and are fully incorporated by reference herein. Applicant's inclusion of multiple references herein is not an admission that any particular reference or references, alone or in combination, is necessarily relevant or anticipates or makes obvious the present disclosure.

BRIEF DESCRIPTION OF THE DRAWINGS

The accompanying drawings, which are incorporated in and constitute a part of this specification, illustrate embodiments and together with the description, serve to explain and illustrate the principles of the Diamond Doped Semiconductor and Method of Production (hereinafter referred to simply as the "Diamond Doped Semiconductor Method") as disclosed herein.

DETAILED DESCRIPTION—LISTING OF ELEMENTS

| Element Description | Element Number |
|---|---|
|  | 1 |
|  | 2 |
|  | 4 |
|  | 5 |
|  | 6 |
|  | 7 |
| Assembly | 8 |
|  | 9 |
|  | 11 |
| Ablative layer | 12 |
|  | 13 |
| Confinement layer | 14 |
|  | 15 |
|  | 16 |
|  | 17 |
|  | 18 |
|  | 19 |
| Laser beam | 20 |
|  | 21 |
| Mask | 22 |
|  | 23 |
| Focus lens | 24 |
|  | 25 |
| Target area | 26 |
|  | 27 |
| XYZ stage | 28 |
| Graphite | 29 |
| Dopants | 30 |
| Diamond seed materials | 31 |
| Sapphire seed materials | 32 |
| Metal | 33 |
| Insulator | 34 |
| Doped diamond Semiconductor | 35 |
| N (negative) | 35a |
| N(positive) | 35b |
| P(positive) | 35c |
| P(negative) | 35d |
|  | 36 |
| Conductor | 37 |
| Integrated circuit | 38 |

| Element Description | Element Number |
| --- | --- |
| Resistor | 39 |
| Electrical component | 40 |
| Thermal component | 50 |
| Quantum computing component | 60 |
| Doped Diamond Semiconductor and Method of Manufacturer | 100 |

DETAILED DESCRIPTION

Before the present Doped Diamond Semiconductor and Method of Manufacture 100 is disclosed and described, it is to be understood that the Doped Diamond Semiconductor and Method of Manufacture 100 is not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes. Disclosed are components and methods that can be used with at least one embodiment of the disclosed Doped Diamond Semiconductor and Method for Manufacture 100. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all potential embodiments of the Doped Diamond Semiconductor and Method for Manufacture 100. This applies to all aspects of this application including, but not limited to, components of a Doped Diamond Semiconductor and Method for Manufacture 100. Thus, if there are a variety of additional components that can be added it is understood that each of these additional components can be added with any specific embodiment or combination of embodiments of the Doped Diamond Semiconductor and Method for Manufacture 100. The present Doped Diamond Semiconductor and Method of Manufacture 100 may be understood more readily by reference to the following detailed description of the embodiments and the examples included therein and to the Figures and their previous and following description.

Figure 1:
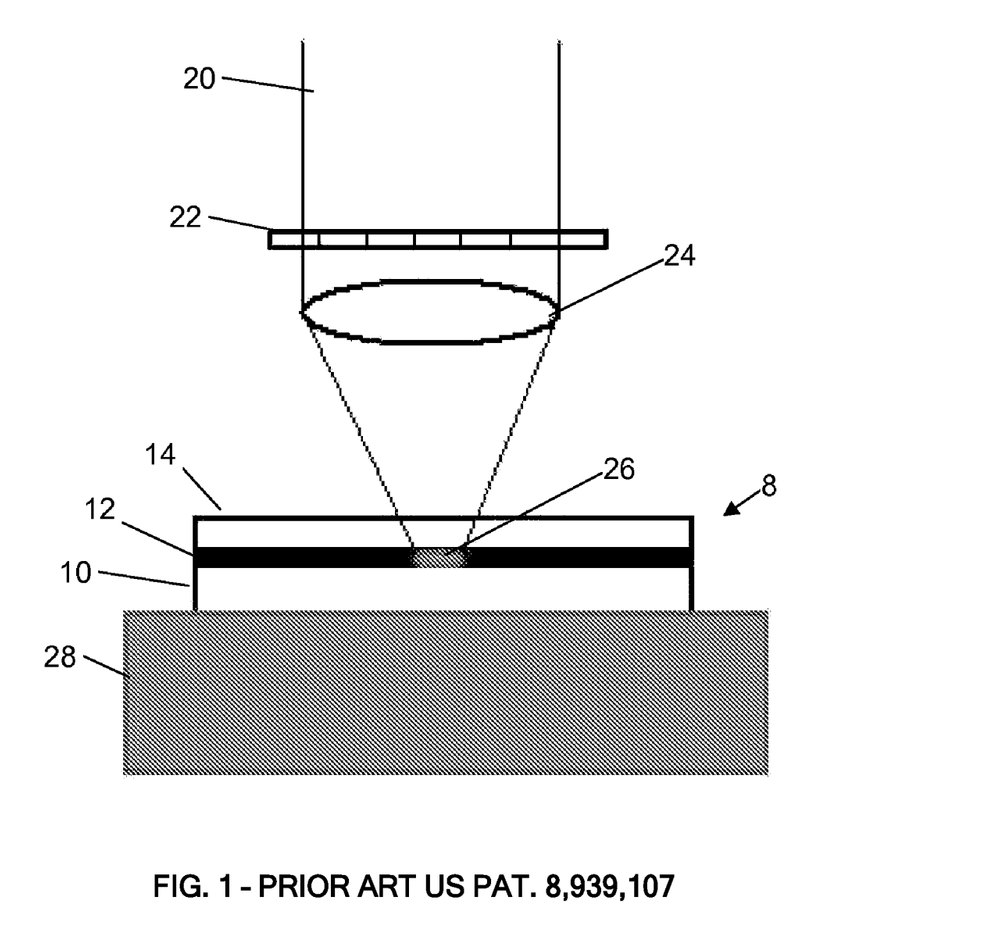
FIG. 1 is a schematic diagram of an exemplary confined pulse laser deposition setup as taught in U.S. Pat. No. 8,939,107, incorporated by reference herein.

The concept of confined pulse laser deposition is illustrated in FIG. 1 from U.S. Pat. No. 8,939,107 incorporated by reference herein. A frame (not shown) is fixed to a sample assembly 8 that includes a backing plate 10, an ablative layer 12 and a transparent confinement layer 14. The frame clamps the backing plate 10 to the confinement layer 14 with the ablative layer sandwiched between the backing plate 10 and the confinement layer 14. The ablative layer 12 can be graphite 29, metal 33 or other thin film coating that can absorb laser energy. The confinement layer 14 can be made of various materials transparent to the laser, for example glass or sapphire. As used in the processes described at FIGS. 2-6, the transparent confinement layer 14 can be made of various materials transparent to the laser, including a layer of graphite particles of sufficient size and/or depth to act as a sufficient confinement layer to support production of diamond semiconductor material after confined pulsed laser deposition. As used herein, the graphite particles may range in size from "nano" to "micro" to "macro" as the sizing of the graphite particles is known to one of ordinary skill. Further, it will be appreciated that the particular application will determine the size of graphite particles most suitable. The ablative layer 12 will be transformed to a metaphase after confined pulsed laser deposition. The frame can include screws or other fastening mechanism to provide close contact between the confinement layer 14 and the backing plate 10. A frame may not be needed or required for the processes of FIGS. 2-6. The space between the confinement layer 14 and the ablative layer 12 can preferably be adjusted by the fastening mechanism and/or by inserting a separator, for example aluminum foil. The sample assembly 8 can be placed on an XYZ-stage 28 that can position the sample assembly 8 in a desired location.

The mechanism for generating pressure is similar to that of laser shock peening, which is a well-known technique for high pressure processing of metallic components. In operation, a laser beam 20 is directed to pass through a focus lens 24 that controls the final spot size of the laser beam 20. Optionally, a beam diffuser, shaper, or mask 22 can be placed in the optical path of the laser beam 20 to make the intensity distribution of the laser beam 20 more uniform. When the laser beam 20 transmits through the transparent confinement layer 14 and irradiates the target 26 of the ablative layer 12, the ablative layer 12 vaporizes and ionizes into hot plasma. The ionized plasma gas is confined by the confinement layer 14 and generates a strong shock wave, which provides a sufficient local pressure to synthesize metaphase from the ablative layer 12. For example, when the ablative layer 12 is a graphite coating 29, sufficient local pressure is generated to synthesize diamond phase carbon from the graphite coating. One of ordinary skill will appreciate that "coating" is not meant to imply a size and subject to the particular application, the graphite coating may be very thin (0.01 cm or very thick and substantial i.e. 2.0 cm) subject to the particular application to and as suitable for a particular application without limitation or restriction. In other embodiments, the confinement layer 14 may be graphite particles with the ablative layer sandwiched between the backing plate 10 and the confinement layer 14. The ablative layer 12 can also be a mixture including graphite 29 and dopants 30, diamond seeding material 31, sapphire seeding material 32, metal 33, or other thin film coating materials, alone or in combination, that can absorb laser energy. Metals that may be used in this process may include but are limited to copper, zinc, steel, nickel, gold, silver, platinum, titanium, titanium nitride, and tungsten, and combinations therein.

Confined pulse laser deposition can have several advantages over other synthesizing techniques. For example, the laser source 20 can be highly controllable and reproducible, and operating conditions can be easily changed. The laser-induced pressure in the confined configuration is four to ten times greater than the pressure in conventional pulse laser deposition. The focus lens 24 and the XYZ-stage 28 allow careful control over the target area 26 of the ablative layer 12 to be irradiated by the laser beam 20. This technique can be used in combination with other techniques, such as by adding another laser for heating, inserting a mask into the laser beam for patterning, or utilizing alternative atmosphere environments for protection. (not shown)

As defined herein, a mask 22 may be a mask set or a photomask set which is a series of electronic data that define geometry for the steps of semiconductor fabrication as commonly understood and further as disclosed herein. Each of the physical masks generated from this data is typically called a photomask. As is known to one of ordinary skill in the art, a mask set for a modern process contain many masks, up to twenty or more masks, each of which defines a specific step in the semiconductor fabrication process. Examples of masks include: p-well, n-well, active, poly, p-select, n-select, contact metal, 1, 2, 3. The presently disclosed method and process may incorporate masks as understood in the prior art for use in the present disclosure, without restriction or limitation.

The physical processes of confined pulse laser deposition can be described in three stages. In the first stage, the target is ablated by pulsed laser radiation; the graphite coating vaporizes immediately and creates a dense plasma plume which continues absorbing the laser energy. The heating and condensing of the plasma plume results in the formation of a variety of carbon species including clusters, single atoms, or ions. Kinetic energies of these carbon species are much higher than thermal. As the plasma pressure goes to its peak, the carbon species may aggregate and form carbon clusters by collision or diffusion. In the second stage, the plasma experiences an adiabatic cooling and maintains the applied pressure after the switch-off of the laser. The third stage is the adiabatic cooling of the recombined plasma until it completely cools down.

The apparatus may also include a laser beam 20 that irradiates and ablates the ablative coating through the transparent confinement layer, and induces a high-pressure between the confinement layer and the backing plane to synthesize a metaphase from the ablative layer. The confinement layer and the backing plane confine the ablative coating to cause the high-pressure between the confinement layer and the backing plane. The laser beam 20 is used at generally ambient room temperature and pressure. The confinement layer may be comprised of the same material as the ablative layer, where the difference between the confinement layer and the ablative layer is defined by function and not material composition. The upper layer can provide the confinement as the light that passes through the upper layer and ablates a lower layer, perhaps due to a beam focused below the surface.

In another embodiment the ablative coating can be a graphite coating that transforms into diamond phase carbon. The ablative coating can also be a metal or a thin film coating. The ablative coating may contain dopants 30 and/or diamond seed materials 31. The apparatus can also include a focus lens, wherein the laser beam is directed through the focus lens to control the final spot size of the laser beam on the ablative coating. The apparatus can also include a beam diffuser or shaper, where the laser beam is directed through the beam diffuser to make the laser beam intensity more uniform. The apparatus can also include an XYZ-stage to position a desired target area 26 of the ablative coating to be irradiated by the laser beam. As illustrated by the reference to U.S. Pat. No. 8,939,107, incorporated by reference herein, the laser beam can have an intensity of less than about 6 $GW/cm^2$, or less than about 4 $GW/cm^2$. The laser beam can have an excitation wavelength of about 568 nm. One of ordinary skill will appreciate that in no way is the laser intensity limited to the ranges provided herein and may be less than 4 $GW/cm^2$, or more than 6 $GW/cm^2$, without limitation or restriction, as sufficient for the properties of the diamond phase carbon sought. Furthermore, use of a laser beam having an excitation wavelength of about 568 nm is for illustrative purposes only and other excitation wavelengths greater than 568 nm and/or less than 568 nm are contemplated and may be used without restriction or limitation as sufficient for the properties of the diamond phase carbon sought. In one embodiment excitation wavelengths of 1064 nm were used with success. Generally, any wavelength of light may be used including ultraviolet, infra-red and visible light. The laser pulse may be varied by width, the number of pulses, and energy per pulse incident upon the ablative layer, as is suitable to the particular application without limitation or restriction.

Figure 2:
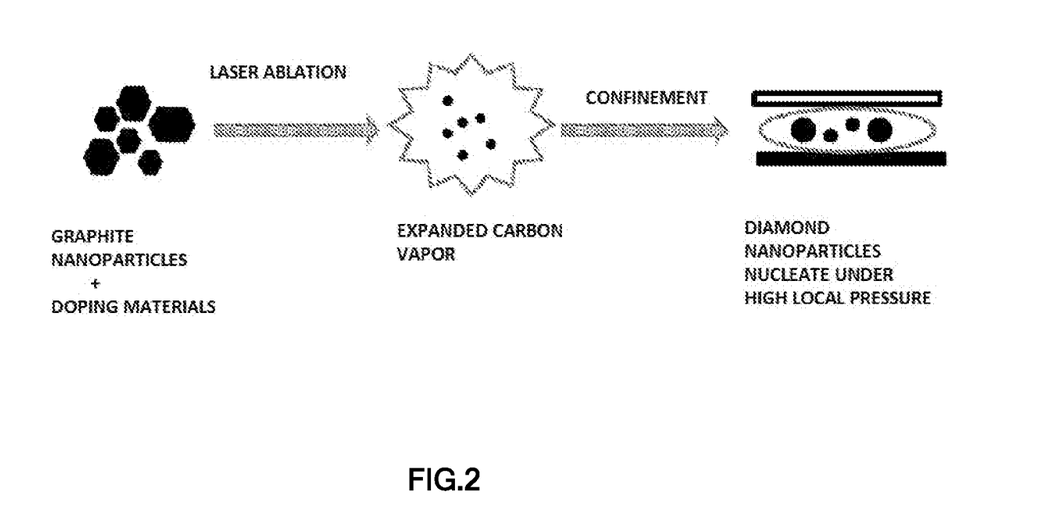
FIG. 2 is a schematic diagram of a forming process for diamond phase carbon using a laser with doping materials added to the graphite particles.

FIG. 2 provides a schematic diagram of a forming process for diamond phase carbon using a laser with doping materials added to the graphite particles. As previously disclosed, possible doping materials (dopants) 30 may include, without restriction or limitation the following: boron, aluminium, nitrogen, gallium, indium, phosphorus, phosphine gas, arsenic, antimony, bismuth, lithium, germanium, silicon, xenon, gold, platinum, gallium arsenide, tellurium, sulphur, tin, zinc, chromium, gallium phosphide, magnesium, cadmium telluride, chlorine, sodium, cadmium sulfide, iodine, fluorine, each acting alone or in combination with any of the preceding elements, in any formulation, to activate the reaction sought to produce a material useful in production of a semiconductor or conductor suitable for the purpose of modulating the electrical, thermal or quantum properties of the material produced. One of ordinary skill will appreciate that when using dopants with this process, to manipulate thermal properties or quantum state properties, the resulting diamond material is not by definition a diamond semiconductor, as will be discussed further herein. As used for a quantum computing application and substrate, the resulting doped diamond material is an N-V center for a quantum computer. Nitrogen (N) would be the dopant. There would be secondary operations to achieve the vacancy (V). Doping the carbon graphene to manipulate thermal properties is also not a semiconductor and is isotopically pure c12 or c13 diamonds.

Figure 3:
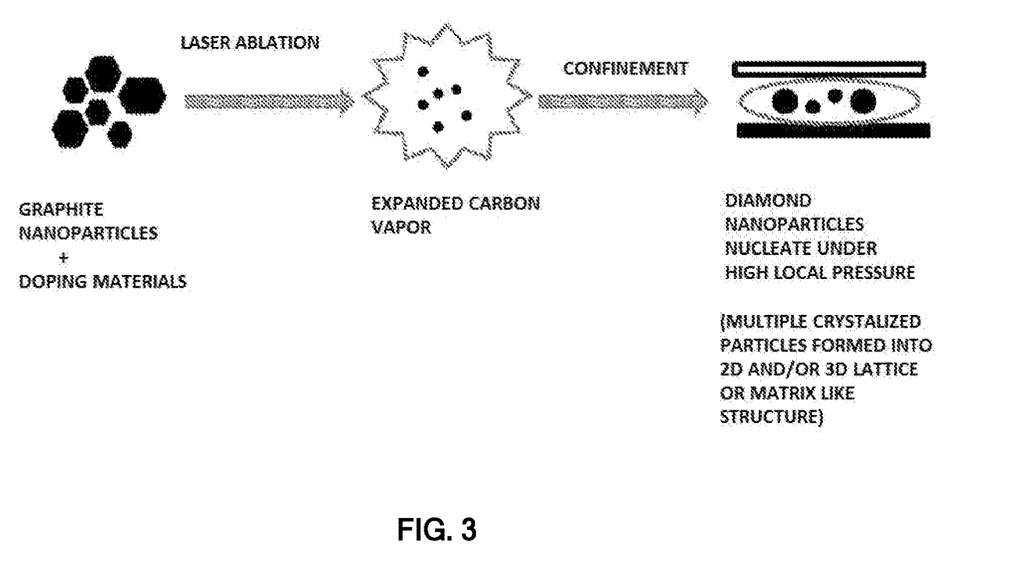
FIG. 3 is a schematic diagram of a forming process for diamond phase carbon using a laser with doping materials added to the graphite particles wherein multiple crystallized particles are formed into 2D and/or 3D lattice or matrix like structures as the output from the process.

FIG. 3 is a schematic diagram of a forming process for diamond phase carbon using a laser with doping materials added to the graphite nanoparticles wherein multiple crystallized particles are formed into 2D and/or 3D lattice or matrix like structures as the output from the process.

Figure 4:
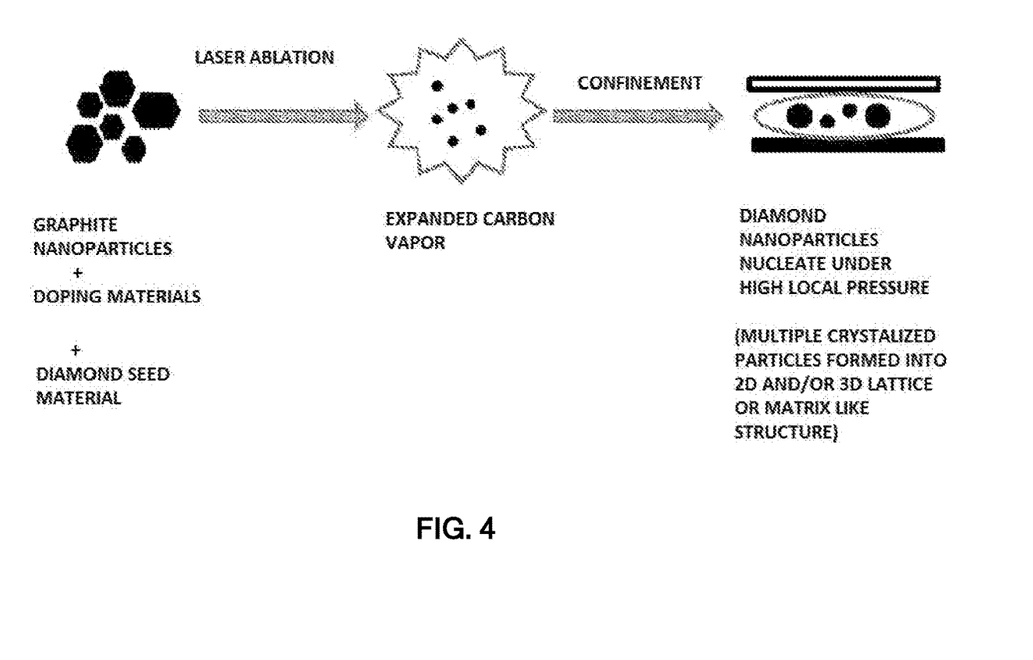
FIG. 4 is a schematic diagram of a forming process for diamond phase carbon using a laser with doping materials and diamond seed material added to the graphite particles wherein multiple crystallized particles are formed into 2D and/or 3D lattice or matrix like structures as the output from the process.

FIG. 4 is a schematic diagram of a forming process for diamond phase carbon using a laser with doping materials and diamond seed material added to the graphite particles wherein multiple crystallized particles are formed into 2D and/or 3D lattice or matrix like structures as the output from the process.

Figure 5:
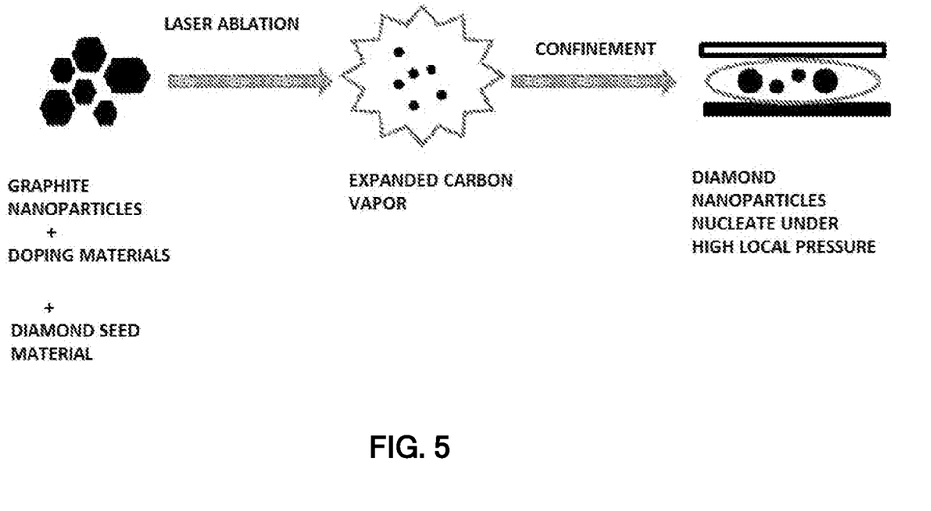
FIG. 5 is a schematic diagram of a forming process for diamond phase carbon using a laser with doping materials and diamond seed material added to the graphite particles.

FIG. 5 is a schematic diagram of a forming process for diamond phase carbon using a laser with doping materials and diamond seed material added to the graphite particles.

Figure 6:
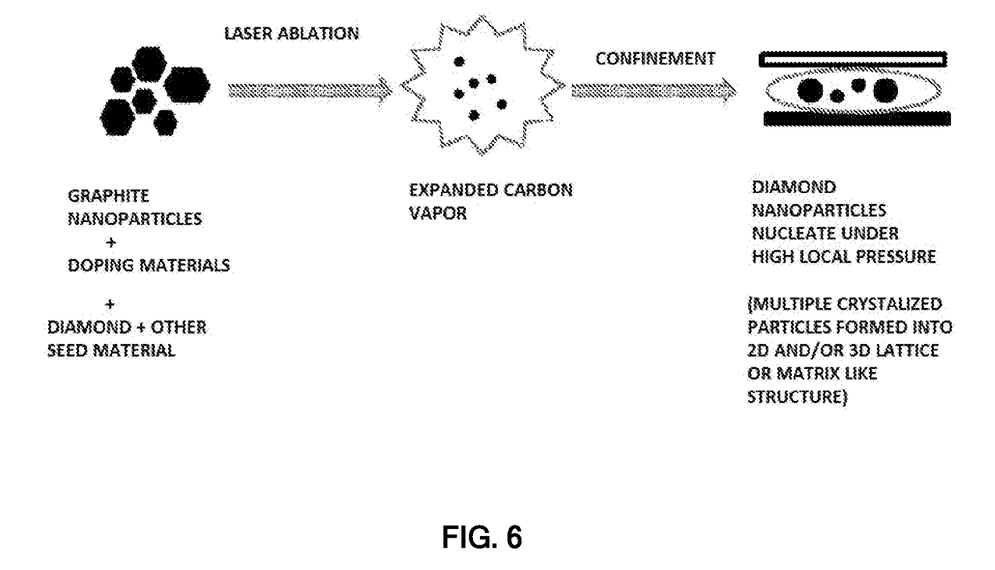
FIG. 6 is a schematic diagram of a forming process for diamond phase carbon using a laser with doping materials and diamond and other materials used for seed material are added to the graphite particles and wherein multiple crystallized particles are formed into 2D and/or 3D lattice or matrix like structures as the output from the process.

FIG. 6 is a schematic diagram of a forming process for diamond phase carbon using a laser with doping materials and diamond and other materials used for seed material are added to the graphite nanoparticles and wherein multiple crystallized particles are formed into 2D and/or 3D lattice or matrix like structures as the output from the process.

The apparatus for performing confined pulsed laser deposition at generally ambient room temperature and pressure as suggested by FIGS. 2-6 may also include an apparatus having a backing plane 10, an ablative coating 12 placed on the backing plane and a transparent confinement layer 14 positioned on the backing plane 10, wherein the ablative coating 12 is sandwiched between the backing plane 10 and the transparent confinement layer 14. The transparent confinement layer 14 may also be loose graphite particles which are transparent to the laser beam 20 used in the process. Doping materials (dopant) 30 may be added to the ablative layer 12 which may also be loose graphite particles, similar to those in the transparent confinement layer 14. Further, doping materials (dopants) 30 may be added to the material forming the ablative layer 12, prior to the laser beam 20 acting therein, to promote formation of diamond particles having desirable semiconductor properties via the action of the laser beam 20 focused on target area 26 within the ablative layer 12. Further, as shown in FIGS. 2-6, diamond seed material 32 may be added to the material forming the ablative layer 12, prior to the laser beam 20 acting therein, to promote formation of diamond particles having desirable semiconductor properties via the action of the laser beam 20 upon the ablative coating 12.

Figure 7:
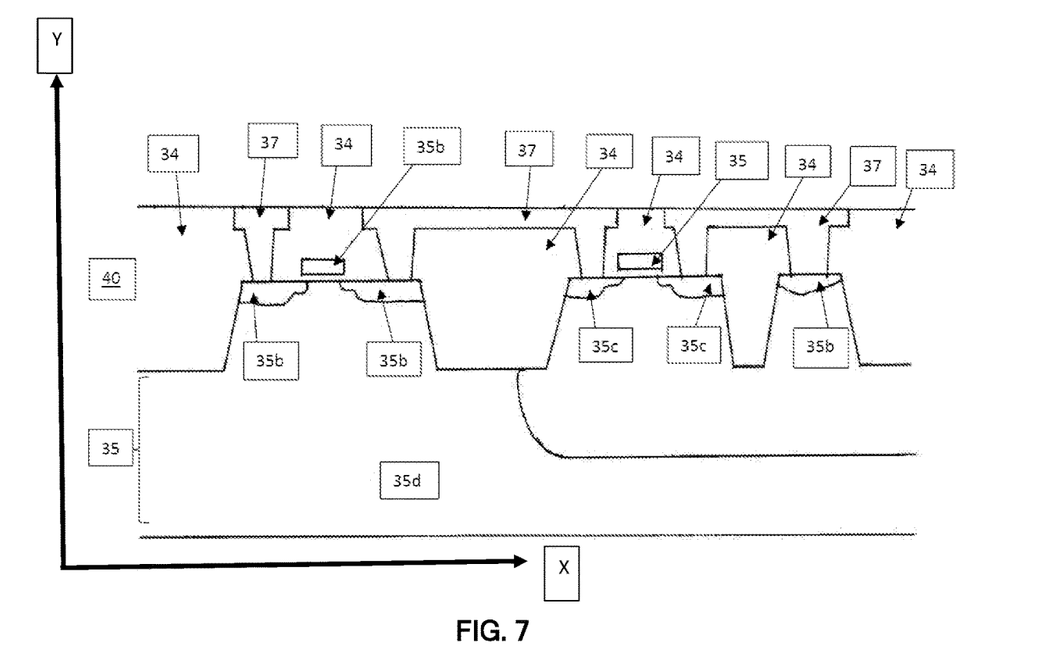
FIG. 7 provides a top view of an illustrative embodiment of an electrical component commonly known as a CMOS circuit that may be produced via the present disclosure.

FIG. 7 is an illustrative top view of an electrical component 40 that may be produced via the current process. As shown, one electrical component 40 that could be produced with the present method, without limitation or restriction, would be a CMOS invertor. As shown, the insulator 34, the doped diamond semiconductor 35 and the conductor 37 are electrically connected, lie in a single plane and are integrally formed for transmission of an electrical signal across the electrical component. As shown, the insulator 34 is primarily diamond but may be made with other components including silicon oxide (SiO2), particularly for the insulators located in the upper portion of the electrical component 40, without departure from the present process. As shown, the structure of the doped diamond semiconductor 35 has been arranged via the process to behave as required by the CMOS invertor design including positions for N (negative) 35a, an N (positive) 35b, a P (positive) 35c, and a P (negative) 35d. Further, various conductors 37, typically composed of metal are positioned within the electrical component 40 and proximate to or adjacent any of the first portion primarily defined as an insulator 34, the second portion formed from and composed of a doped diamond semiconductor 35, wherein the first portion and the second portion are electrically connected, lie in a single plane and are integrally formed for transmission of electricity across the electrical component 40. One of ordinary skill will appreciate that integral formation using the process described herein of the first portion and the second portion in a single plane allows for the first portion and second portion to be proximate and adjacent without being applied as layers.

Although not shown, one of ordinary skill will appreciate that any number and combination of electrical components 40 may be produced using this process including subcomponents including a resistor, a transistor, a capacitor, an inverter (shown), an inductor or a diode and or a combination therein to produce an integrated electrical component having the various subcomponents electrically connected and positioned in a single plane for transmission of electricity across the electrical component 40. Together, the combination of electrical components may be formed together as an integrated circuit 38 (not shown). Although not shown, a resistor may be produced by at least a first portion formed from and composed of diamond, the first portion primarily defined as an insulator 34 and at least a second portion formed from and composed of a doped diamond semiconductor 35, the second portion primarily defined and configured to be a conductor 37 and wherein the first portion and the second portion are electrically connected, lie in a single plane and are integrally formed for transmission of electricity across the electrical component 40.

Another electrical component 40 (not shown) may be formed by at least a first portion formed from and composed of diamond, the first portion primarily defined as an insulator 34 and then at least a second portion formed from and composed of graphite 29, the second portion primarily defined as a conductor 37 with at least a third portion formed from and composed of a doped diamond semiconductor 35, the third portion primarily defined as a semiconductor, wherein the first portion, the second portion and the third portion are integrally formed and work together for transmission of an electrical signal across the electrical component 40. In another embodiment of an electrical component, a metal could be present in the second portion and act primarily as a conductor 37.

One of ordinary skill will appreciate that the present process allows for the creation of electrical components, an integrated circuit or microchip by allowing the graphene to act as the conductor, the diamond to act as the insulator and the doped diamond to act as the semiconductor. The ability to control these elements with the precision of the laser spot size enables precise control of the features. Doping for quantum computer preparation can be done using nitrogen as the dopant material, without exclusion or limitation as to other materials useful as dopants, for N-V center type manipulation useful for a quantum computer application, wherein Nitrogen (N) may be the dopant with other secondary operations to achieve the vacancy (V).

Having described the preferred embodiments, other features of the Doped Diamond Semiconductor and Method of Manufacture will undoubtedly occur to those versed in the art, as will numerous modifications and alterations in the embodiments as illustrated herein, all of which may be achieved without departing from the spirit and scope of the Doped Diamond Semiconductor and Method of Manufacture disclosed herein. Accordingly, the methods and embodiments pictured and described herein are for illustrative purposes only, and the scope of the present disclosure extends to all method and/or structures for providing increased functionality and longevity in the use and production of Doped Diamond Semiconductor and Method of Manufacture therein. Furthermore, the methods and embodiments pictured and described herein are in no way limiting to the scope of the Doped Diamond Semiconductor and Method of Manufacture of use unless so stated in the following claims.

It should be noted that the Doped Diamond Semiconductor and Method of Manufacture is not limited to the specific embodiments pictured and described herein, but is intended to apply to all similar apparatuses and methods for providing the various benefits and/or features of a Doped Diamond Semiconductor and Method of Manufacture. Modifications and alterations from the described embodiments will occur to those skilled in the art without departure from the spirit and scope of the Doped Diamond Semiconductor and Method of Manufacture. It is understood that the Doped Diamond Semiconductor and Method of Manufacture as disclosed herein extends to all alternative combinations of one or more of the individual features mentioned, evident from the text and/or drawings, and/or inherently disclosed. All of these different combinations constitute various alternative aspects of the Doped Diamond Semiconductor and Method of Manufacture and/or components thereof. The embodiments described herein explain the best modes known for practicing the Doped Diamond Semiconductor & Method and/or components thereof and will enable others skilled in the art to utilize the same. The claims are to be construed to include alternative embodiments to the extent permitted by the prior art.

While the Doped Diamond Semiconductor and Method of Manufacture has been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including but not limited to: Matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as illustrative only, with a true scope and spirit being indicated by the following claims.

What is claimed is:

1. A confined pulsed laser deposition method for production of an electrical component comprising:
    a) placing an ablative coating between a transparent confinement layer and a backing plane, wherein the ablative coating is composed of graphite particles and a dopant material;
    b) directing a laser beam through the transparent confinement layer to irradiate and ablate the ablative coating at generally ambient temperature and pressure;
    c) vaporizing the ablative coating into an oxidized plasma gas using the laser beam;
    d) confining the vaporized ablative coating using the confinement layer to generate laser induced pressure between the confinement layer and the backing plane; and,
    e) synthesizing a metaphase from the ablative coating using the laser induced pressure between the confinement layer and the backing plane forming an electrical component therein, the electrical component further comprising:
        i. at least a first portion formed from and composed of diamond, the first portion primarily defined as an insulator;
        ii. at least a second portion formed from and composed of graphite, the second portion primarily defined as a conductor;
        iii. at least a third portion formed from and composed of a doped diamond, the third portion primarily defined as a semiconductor;
        iv. wherein the first portion, the second portion and the third portion are electrically connected, lie in a single plane and integrally formed for transmission of an electrical signal across the electrical component.

2. The confined pulsed laser deposition method for production of an electrical component according to claim 1 wherein a metallic compound is present in the second portion.

3. The confined pulsed laser deposition method for production of an electrical component according to claim 1 formed as a resistor, a transistor, capacitor, inverter, an inductor or a diode or combination therein.

4. The confined pulsed laser deposition method for production of an electrical component according to claim 2 formed as a resistor, a transistor, capacitor, inverter, an inductor or a diode or combination therein.

5. The confined pulsed laser deposition method for production of an electrical component according to claim 1 formed as a resistor, a transistor, capacitor, inverter, an inductor or a diode or combination therein and a plurality of the electrical components are further assembled to form an integrated circuit.

6. The confined pulsed laser deposition method for production of an electrical component according to claim 1, wherein the ablative coating includes metal.

7. The confined pulsed laser deposition method for production of an electrical component according to claim 1, wherein the dopant material is selected from the selected from the group comprising: boron, aluminium, nitrogen, gallium, indium, phosphorus, phosphine gas, arsenic, antimony, bismuth, lithium, germanium, silicon, xenon, gold, platinum, gallium arsenide, tellurium, sulphur, tin, zinc, chromium, gallium phosphide, magnesium, cadmium telluride, chlorine, sodium, cadmium sulfide, iodine, fluorine, each acting alone or in combination with any of the preceding elements, in any formulation, to activate the reaction sought to produce a material useful in production of a doped semiconductor or a doped conductor suitable for the purpose of modulating the electrical, thermal or quantum properties of the material produced.

8. An electrical component comprising:
    a) at least a first portion formed from and composed of diamond, the first portion primarily defined as an insulator;
    b) at least a second portion formed from and composed of graphite, the second portion primarily defined as a conductor;
    c) at least a third portion formed from and composed of a doped diamond, the third portion primarily defined as a semiconductor;
    d) wherein the first portion, the second portion and the third portion are electrically connected, lie in a single plane, are non-layered and integrally formed for transmission of an electrical signal across the electrical component.

9. The electrical component according to claim 8 wherein the first portion, the second portion and the third portion are adjacent each other in the single plane.

10. The electrical component according to claim 8 wherein the first portion, the second portion and the third portion may be adjacent each other in the single plane.

11. The electrical component according to claim 8 wherein a metallic compound is present in the second portion.

12. The electrical component according to claim 8 formed as a resistor, a transistor, capacitor, inverter, an inductor or a diode or combination therein.

13. The electrical component according to claim 8 formed as a resistor, a transistor, capacitor, inverter, an inductor or a diode or combination therein and a plurality of the electrical components are further assembled to form an integrated circuit.

14. The electrical component according to claim 8 formed for the purpose of modulating the electrical, thermal or quantum properties of the electrical component.

15. The electrical component according to claim 8 formed for the purpose of modulating the electrical, thermal or quantum properties of a circuit to which the electrical component is connected.

16. An electrical component comprising:
 a) at least a first portion formed from and composed of diamond, the first portion primarily defined as an insulator;
 b) at least a second portion formed from and composed of doped diamond, the second portion primarily defined as a conductor;
 c) wherein the first portion and the second portion are electrically connected, lie in a single plane and are integrally formed for transmission of electricity across the electrical component.

17. The electrical component according to claim 14 wherein the electrical component is a resistor.

18. The electrical component according to claim 14 wherein a third portion is formed from and composed of a doped diamond, the third portion primarily defined as a semiconductor and wherein the first portion, the second portion and the third portion lie in a single plane, are integrally formed and electrically connected for transmission of electricity across the electrical component.

* * * * *